(12) United States Patent
Tu et al.

(10) Patent No.: US 12,363,861 B2
(45) Date of Patent: Jul. 15, 2025

(54) FLOW DIVIDING DEVICE AND IMMERSION COOLING SYSTEM HAVING THE SAME

(71) Applicant: Wiwynn Corporation, New Taipei (TW)

(72) Inventors: Tai-Ying Tu, New Taipei (TW); Yi Cheng, New Taipei (TW); Chin-Han Chan, New Taipei (TW); Ting-Yu Pai, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 372 days.

(21) Appl. No.: 17/952,561

(22) Filed: Sep. 26, 2022

(65) Prior Publication Data

US 2024/0008223 A1    Jan. 4, 2024

(30) Foreign Application Priority Data

Jun. 30, 2022    (TW) .................................. 111124645

(51) Int. Cl.
*H05K 7/20*    (2006.01)

(52) U.S. Cl.
CPC ......... *H05K 7/203* (2013.01); *H05K 7/20318* (2013.01); *H05K 7/20327* (2013.01)

(58) Field of Classification Search
CPC ............... H05K 7/203; H05K 7/20236; H05K 7/20272; H01L 23/427; B01D 17/0211; B01D 17/10

See application file for complete search history.

(56) References Cited

U.S. PATENT DOCUMENTS

| 367,308 | A | * | 7/1887 | Macnab, Sr. et al. ....................... B01D 21/0045 210/521 |
| 801,330 | A | * | 10/1905 | Moore ............... B01D 17/0208 210/540 |
| 1,672,583 | A | * | 6/1928 | Travers .............. B01D 17/0211 210/801 |
| 4,949,164 | A | * | 8/1990 | Ohashi .................. H01L 23/427 165/80.4 |
| 5,132,010 | A | * | 7/1992 | Ossenkop .......... B01D 17/0214 210/522 |
| 5,458,770 | A | * | 10/1995 | Fentz ................. B01D 17/0211 210/171 |

(Continued)

OTHER PUBLICATIONS

Examination report dated Feb. 15, 2023, listed in correspondent Taiwan patent application No. 111124645.

*Primary Examiner* — Jianying C Atkisson
*Assistant Examiner* — For K Ling
(74) *Attorney, Agent, or Firm* — McClure, Qualey & Rodack, LLP

(57) ABSTRACT

A flow dividing device including a box body and a baffle set is provided. The box body includes a chamber, an inflow port, and an outflow port. The baffle set is located in the chamber and divides the chamber into a plurality of guide channels, and two ends of the guide channel communicate with the inflow port and the outflow port respectively. After flowing into the flow dividing device, the condensate fluid can guide different liquids in the condensate fluid to separate from each other. An immersion cooling system including the flow dividing device and a fluid separation method of the immersion cooling system are also provided.

7 Claims, 13 Drawing Sheets

(56) References Cited

U.S. PATENT DOCUMENTS

| | | | | |
|---|---|---|---|---|
| 6,247,480 B1* | 6/2001 | Wegner | ............. | B01D 21/2438 |
| | | | | 210/493.1 |
| 6,558,558 B1* | 5/2003 | Hall | .................. | B01D 17/0211 |
| | | | | 210/221.1 |
| 10,064,313 B2* | 8/2018 | Ishinabe | ............ | H05K 7/20781 |
| 10,512,192 B2* | 12/2019 | Miyoshi | ............ | H01L 21/67109 |
| 10,925,188 B1* | 2/2021 | Keehn | ................ | H05K 7/20318 |
| 10,966,349 B1* | 3/2021 | Lau | .................... | H05K 7/20236 |
| 2014/0216688 A1* | 8/2014 | Shelnutt | ............. | F28D 15/0266 |
| | | | | 165/104.13 |
| 2015/0062806 A1 | 3/2015 | Shelnutt et al. | | |
| 2019/0357379 A1* | 11/2019 | Kolar | ................ | H05K 7/20827 |

* cited by examiner

FLOW DIVIDING DEVICE AND IMMERSION COOLING SYSTEM HAVING THE SAME

CROSS-REFERENCE TO RELATED APPLICATION

This non-provisional application claims priority under 35 U.S.C. § 119(a) to Patent Application No. 111124645 filed in Taiwan, R.O.C. on Jun. 30, 2022, the entire contents of which are hereby incorporated by reference.

BACKGROUND

Technical Field

A cooling system is provided, and in particular, to an immersion cooling system.

RELATED ART

In an existing immersion cooling system, an electronic device is immersed in a cooling tank. A working fluid in the cooling tank absorbs the heat generated by the electronic device and transforms from a liquid state into a gaseous state. The working fluid in the gaseous state returns to the cooling tank after being transformed into the liquid state through condensation by a condensation device.

According to the existing immersion cooling system, improper control of a temperature in the cooling tank or a water temperature of the condensation device causes the air humidity inside the cooling tank and a dew-point temperature in the cooling tank to change. Eventually, as a result, water vapor condenses on the surface of the condensation device, which contaminates the working fluid. In addition, the working fluid may further be contaminated as the cooling water leaks and enters the cooling tank due to aging of the condensation device and damage of a casing. The working fluid contaminated by water, on the one hand, affects the heat absorption performance of the cooling tank. On the other hand, due to the conductive properties of water, the performance of the electronic device may be affected or a public safety accident may occur.

SUMMARY

The disclosure provides a flow dividing device. According to an embodiment, the flow dividing device includes a box body and a baffle set. The box body includes a chamber, and the box body includes an inflow port and an outflow port. In a perpendicular direction, a position of the inflow port is higher than a position of the outflow port. The baffle set is located in the chamber and divides the chamber into a plurality of guide channels, where the guide channels include an inlet channel, a middle channel, and an outlet channel; a top of the inlet channel communicates with the inflow port, a bottom of the inlet channel communicates with the middle channel, the middle channel communicates with the outlet channel, and the outlet channel communicates with the outflow port.

The disclosure further provides an immersion cooling system. According to an embodiment, the immersion cooling system includes a cabinet, a condensation module, a flow guide assembly and a flow dividing device. The cabinet includes an upper accommodating portion and a lower accommodating portion. The condensation module is located inside the upper accommodating portion. The flow guide assembly includes a receiving portion and a guide outlet, and the receiving portion is located below the condensation module. The flow dividing device includes a box body and a baffle set. The box body includes a chamber, and the box body includes an inflow port and an outflow port. In a perpendicular direction, the position of the inflow port is higher than the position of the outflow port, and the outflow port communicates with the lower accommodating portion. The baffle set is located in the chamber and divides the chamber into multiple guide channels, where the guide channels include an inlet channel, a middle channel, and an outlet channel; a top of the inlet channel communicates with the inflow port, a bottom of the inlet channel communicates with the middle channel, the middle channel communicates with the outlet channel, and the outlet channel communicates with the outflow port.

The disclosure further provides a fluid separation method of an immersion cooling system. According to some embodiments, the cooling water is separated from other contaminants in the condensate fluid during the flowing of the condensate fluid. In this way, clean condensate fluid flows in the lower accommodating portion of the immersion cooling system through the outlet channel to cool the electronic device located in the lower accommodating portion.

DETAILED DESCRIPTION

Figure 1:
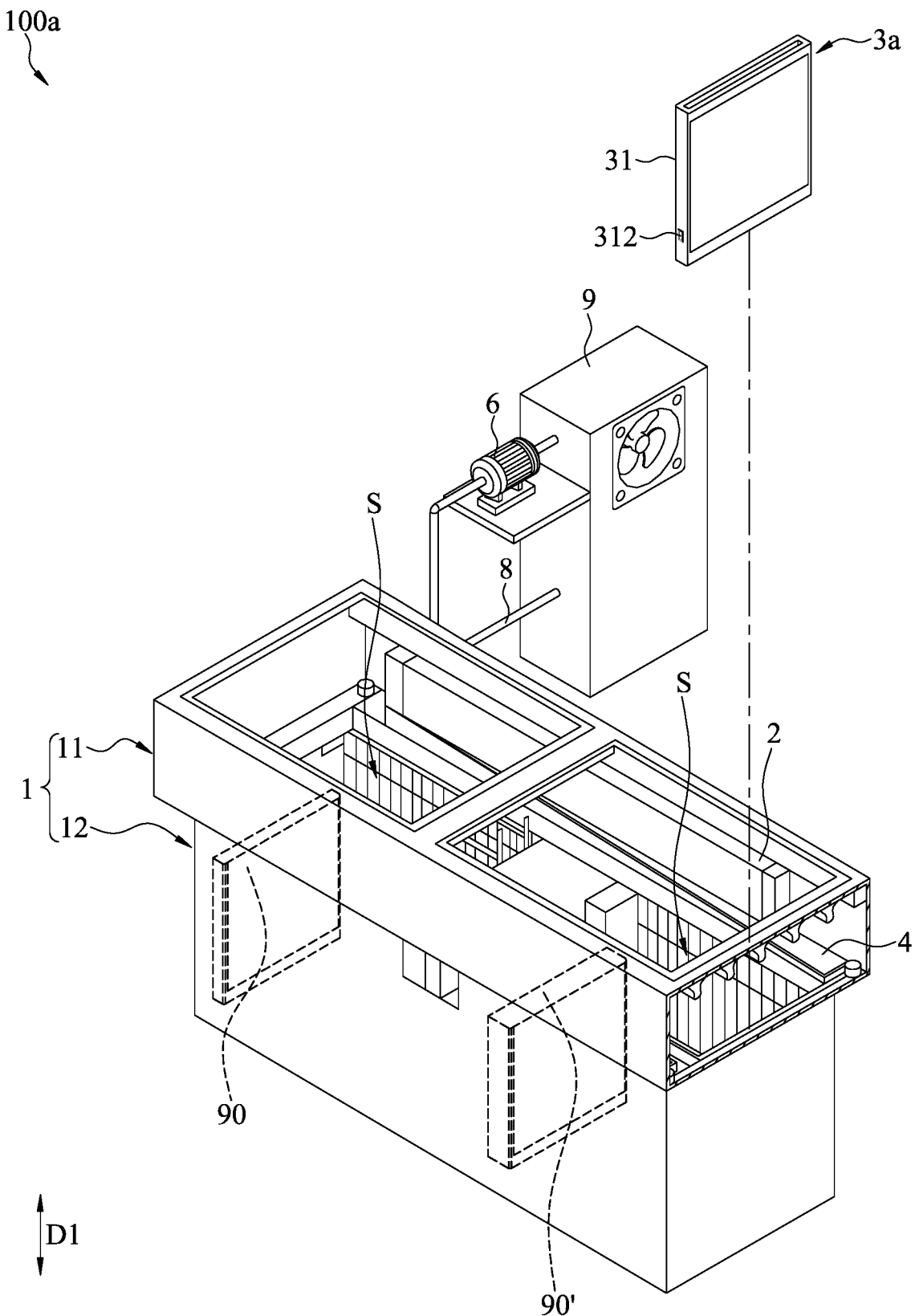
FIG. 1 illustrates a schematic three-dimensional diagram of an immersion cooling system according to an embodiment.
Figure 2:
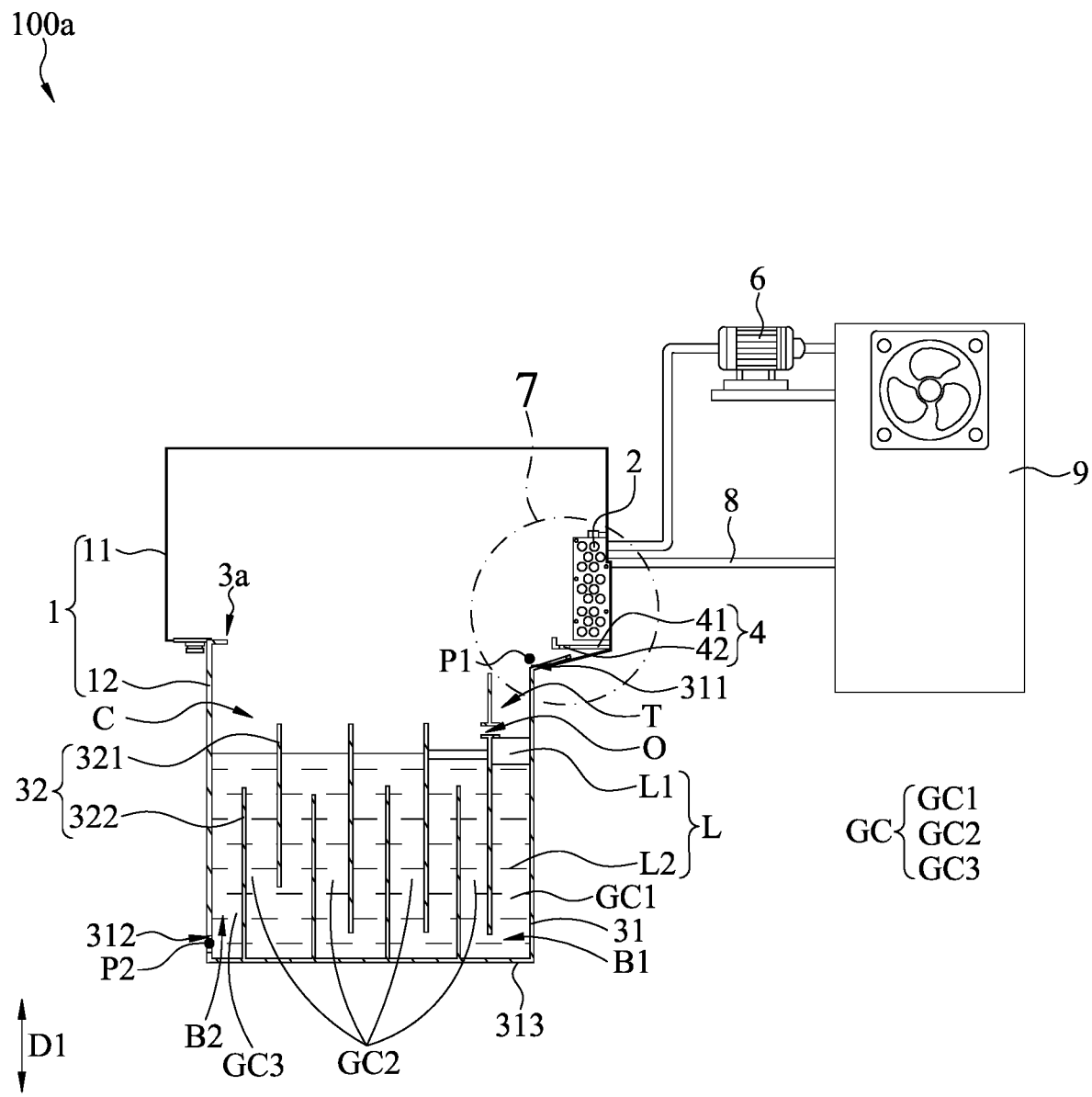
FIG. 2 illustrates a schematic diagram of a usage state of the immersion cooling system according to an embodiment in FIG. 1.

Referring to FIG. 1 and FIG. 2, FIG. 1 illustrates a schematic three-dimensional diagram of an immersion cooling system 100a according to an embodiment. FIG. 2 illustrates a schematic diagram of a usage state of the immersion cooling system 100a according to an embodiment in FIG. 1. The immersion cooling system 100a includes a cabinet 1, a condensation module 2, a flow guide assembly 4, and a flow dividing device 3a. The cabinet 1 includes an upper accommodating portion 11 and a lower accommodating portion 12. The condensation module 2 is located inside the upper accommodating portion 11. The flow guide assembly 4 includes a receiving portion 41 and a guide outlet 42, and the receiving portion 41 is located below the condensation module 2. The flow dividing device 3a includes a box body 31 and a baffle set 32. The box body 31 includes a chamber C, and the box body 31 includes an inflow port 311 and an outflow port 312. In a perpendicular direction D1, a position P1 of the inflow port 311 is higher than a position P2 of the outflow port 312, and the outflow port 312 communicates with the lower accommodating portion 12. The baffle set 32 is located in the chamber C and divides the chamber C into a plurality of guide channels GC. The guide channels GC include an inlet channel GC1, a middle channel GC2, and an outlet channel GC3, where a top T of the inlet channel GC1 communicates with the inflow port 311, a bottom B1 of the inlet channel GC1 communicates with the middle channel GC2, the middle channel GC2 communicates with the outlet channel GC3, and the outlet channel GC3 communicates with the outflow port 312.

The immersion cooling system 100a is applicable to heat dissipation of electronic devices 90, 90'. The electronic devices 90, 90' are for example, but not limited to, servers. According to the embodiment shown in FIG. 1, the industrial standard of the electronic device 90 is 1 U, and the industrial standard of the electronic device 90' is 2 U (details will be described later). A working fluid L2 is contained in the lower accommodating portion 12 of the immersion cooling system 100a, and the electronic devices 90, 90' are immersed in the working fluid L2. When the immersion cooling system 100a and the electronic devices 90, 90' work, the electronic device 90, 90' generates heat which causes the working fluid L2 flowing out from the flow dividing device 3a to vaporize after contacting the electronic devices 90, 90'. As a result, the working fluid L2 transforms from a liquid state into a gaseous state. The working fluid L2 in the gaseous state is cooled down and condensed into the liquid-state working fluid L2 after contacting the condensation module 2. The condensed working fluid L2 drops on the receiving portion 41 (referring to FIG. 2) of the flow guide assembly 4 due to gravity. The receiving portion 41 guides the condensed working fluid L2 to flow into the inlet channel GC1 through the guide outlet 42 and the inflow port 311. The condensed working fluid L2 may be mixed with contaminated cooling water L1. The contaminated cooling water L1 is the water condensed on the surface of the condensation module 2 or water leaked from the condensation module 2. The condensed working fluid L2 and the contaminated cooling water form a condensate fluid L, and the following working fluid L2 flowing into the inlet channel GC1 is called the condensate fluid L.

The receiving portion 41 being located below the condensation module 2 means that in the perpendicular direction D1, the height of the receiving portion 41 is lower than the height of the condensation module 2. The receiving portion 41 of the embodiment shown in FIG. 2 is located perpendicularly under the condensation module 2, and a receiving area of the receiving portion 41 is larger than or equal to a projection area of the condensation module 2 along the perpendicular direction D1. Therefore, the condensate fluid L can directly drop into the receiving portion 41. In an embodiment, the receiving portion 41 is not located perpendicularly under the condensation module 2. The condensed working fluid L2 is guided by the receiving portion 41 through a guide element (not shown in the drawings) from the condensation module 2 to the receiving portion 41.

As can be seen from FIG. 2, the bottom B1 of the inlet channel GC1 communicates with the middle channel GC2, and the position P1 of the inflow port 311 is higher than the position P2 of the outflow port 312. Therefore, the condensate fluid L flowing into the inlet channel GC1 is accumulated and flows in the inlet channel GC1, the middle channel GC2, and the outlet channel GC3. Through the design of the inlet channel GC1, the middle channel GC2, and the outlet channel GC3, the condensate fluid L is retained in the guide channels GC (including the inlet channel GC1, the middle channel GC2, and the outlet channel GC3) for a longer time. Since the specific weight of the cooling water L1 is lower than the specific weight of the working fluid L2, due to buoyancy, the cooling water L1 mixed with the working fluid L2 would eventually floats above the working fluid L2 during said longer time. Therefore, the cooling water L1 is separated from the working fluid L2, ensuring high purity of the working fluid L2 that flows back into the lower accommodating portion 12, and maintaining the efficiency of cooling the electronic device 90 by the working fluid L2. After the immersion cooling system 100a and the electronic device 90 works for a period of time, the cooling water L1 above the working fluid L2 may be removed (e.g., by a user).

Referring to FIG. 2 again, the inflow port 311 and the outflow port 312 of the flow dividing device 3a of the embodiment in FIG. 2 are located on two sides of the box body 31 respectively, which means that the inflow port 311 is located on the right side of the box body 31 (from the perspective of FIG. 2) and the outflow port 312 is located on the left side of the box body 31 (from the perspective of FIG. 2). This is not limited in the disclosure. According to some embodiments, the inflow port 311 and the outflow port 312 are located on the same side of the box body 31.

Referring to FIG. 1 and FIG. 2 again, in an embodiment, the immersion cooling system 100a includes a catheter 8, a pump 6, and a heat exchanger 9. The condensation module 2 is connected to the pump 6 and the heat exchanger 9 through the catheter 8. The pump 6 circulates heat exchange liquid in the heat exchanger 9 and the condensation module 2 through the catheter 8. The heat exchange liquid may be but is not limited to water. As described above, the liquid-state working fluid L2 located in the lower accommodating portion 12 is transformed into the gaseous-state working fluid L2 after absorbing heat generated by the electronic device, and the gaseous-state working fluid L2 contacts the surface of the condensation module 2. Since a temperature of the surface of the condensation module 2 is lower than the temperature of the working fluid L2, the gaseous-state working fluid L2 exchanges heat with the condensation module 2. After the condensation module 2 absorbs the heat of the gaseous-state working fluid L2, the heat is brought to the heat exchanger 9 by the heat exchange liquid inside. The heat exchange liquid flows back to the condensation module 2 after being cooled down in the heat exchanger 9.

According to the embodiment shown in FIG. 2, the flow dividing device 3a does not have a cover body. However, this is not limited in the disclosure. According to some embodiments, the flow dividing device 3f (referring to FIG. 9) may include a cover body 33, and the cover body 33 is configured to cover the box body 31. According to some embodiments, the cover body 33 is detachable for disassembly and assembly by the user.

Figure 3:
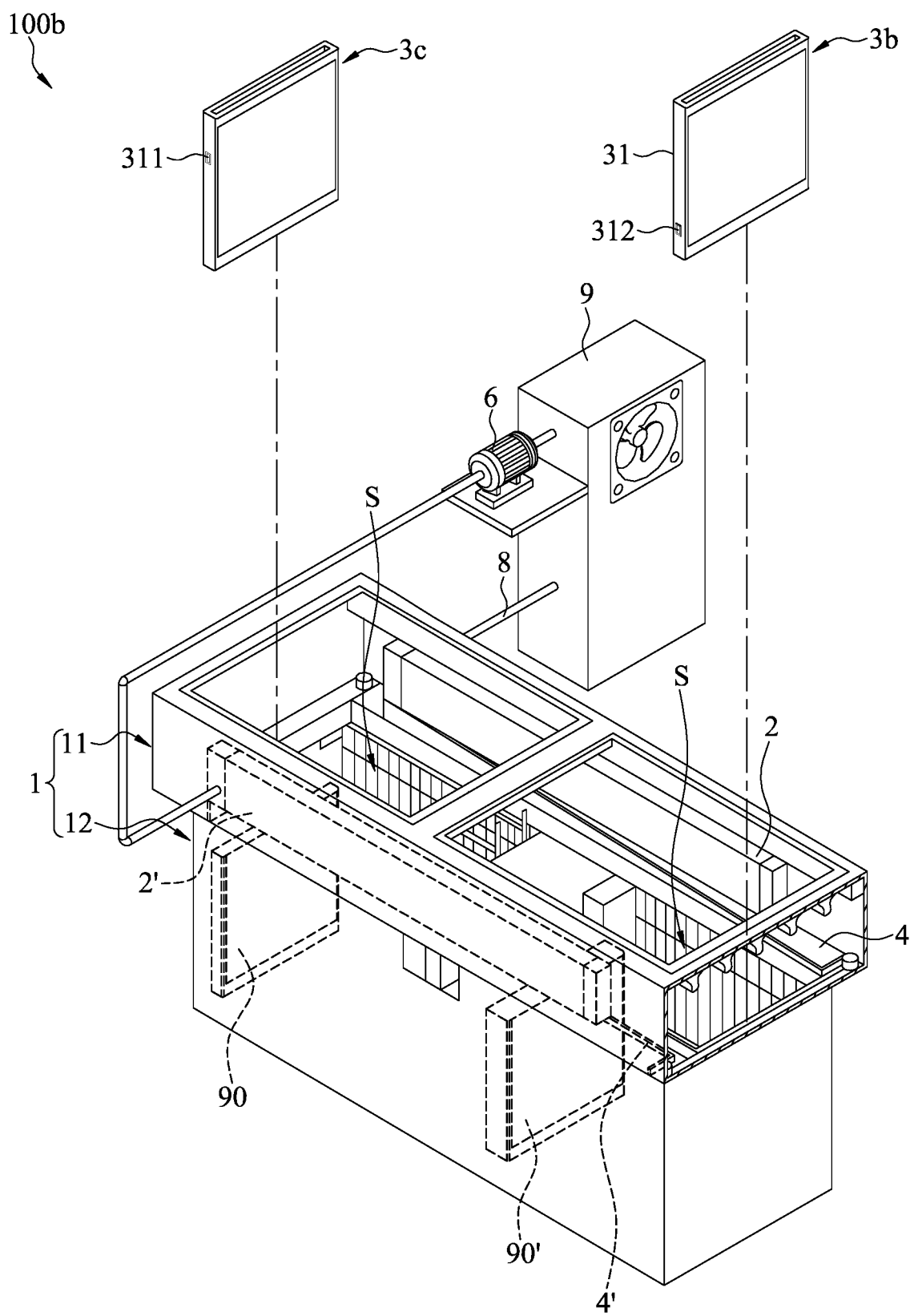
FIG. 3 illustrates a schematic three-dimensional diagram of an immersion cooling system according to an embodiment.

FIG. 3 illustrates a schematic three-dimensional diagram of an immersion cooling system 100b according to an embodiment. According to the embodiment shown in FIG. 3, the immersion cooling system 100b includes two condensation modules 2, 2' and two plug-in flow dividing devices 3b, 3c. The two condensation modules 2, 2' are located on the upper accommodating portion 11 and arranged opposite to each other. The two flow dividing devices 3b, 3c are located on the lower accommodating portion 12 and arranged opposite to each other. According to some embodiments, the user may properly design the flowing direction of the condensate fluid L condensed by the condensation modules 2, 2' with the flow guide effect of the flow guide assemblies 4, 4' to cause the condensate fluid L condensed by the condensation module 2 to flow into the flow dividing device 3b, and the condensate fluid L condensed by the condensation module 2' to flow into the flow dividing device 3c. In this way, through the arrangement of the two condensation modules 2, 2' and the two flow dividing devices 3b, 3c in the embodiment, the immersion cooling system 100b may condense the gaseous-state working fluid L2 more quickly and improve the efficiency of separating the cooling water L1 from the working fluid L2, so as to increase the purity of the working fluid L2 flowing back to the lower accommodating portion 12, and improve the overall cooling efficiency of the immersion cooling system 100b. In the embodiment in FIG. 3, the flow dividing devices 3b, 3c are located on two sides of the lower accommodating portion 12 respectively, so that a middle space is defined between the two flow dividing devices 3b, 3c, to accommodate the electronic devices 90, 90' (such as the servers). In this way, the separated working fluid L2 flows to the middle space after flowing out from the flow dividing devices 3b, 3c located on the two sides, which is beneficial for the working fluid to contact the electronic devices 90, 90' and absorb the heat generated by the operation of the electronic devices 90, 90'.

Figure 4A:
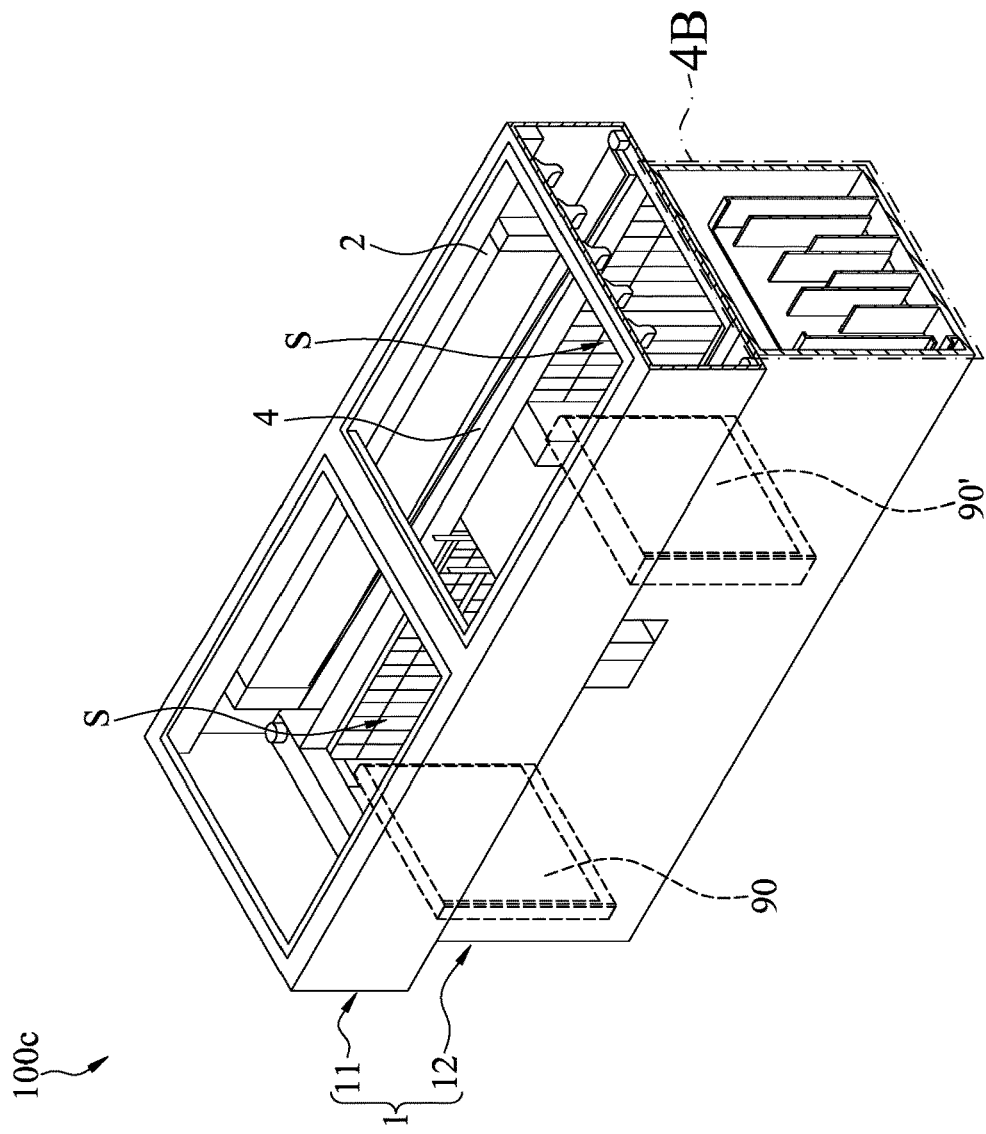
FIG. 4A illustrates a partial schematic cross-sectional diagram of a structure of a flow dividing device according to an embodiment.
Figure 4B:
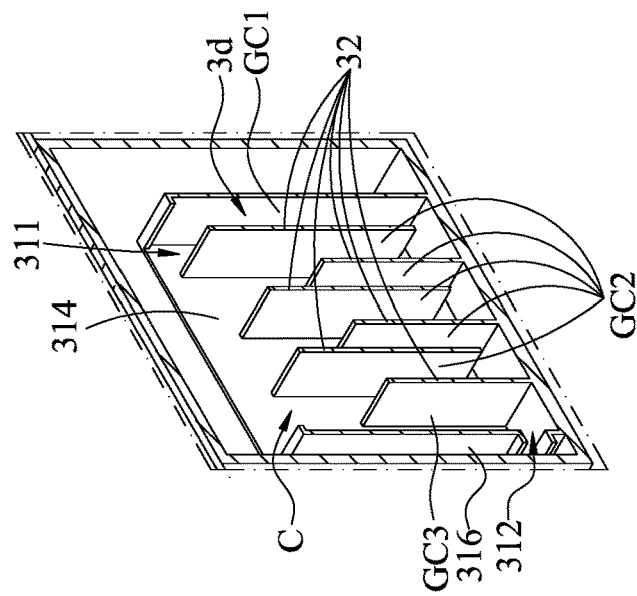
FIG. 4B illustrates a partially enlarged view of a position 4B in FIG. 4A.

The flow dividing devices 3a, 3b, 3c illustrated in the FIG. 1 to FIG. 3 may be plug-in flow dividing devices, but are not limited in the disclosure. Referring to FIG. 4A and FIG. 4B, FIG. 4A illustrates a partial schematic cross-sectional diagram of a structure of a flow dividing device 3d according to an embodiment. FIG. 4B illustrates a partially enlarged view of position of 4B in FIG. 4A. According to the embodiment, the flow dividing device 3d and the lower accommodating portion 12 are integrally formed. That is to say, two sides of the flow dividing device 3d are a side wall 314 and a wall of the lower accommodating portion 12, to define the chamber C. The baffle set 32 is also arranged in the chamber C. The inflow port 311 is located above the inlet channel GC1, and the outflow port 312 is arranged on an outlet wall 316. According to this structure, the condensate fluid L flows into the flow dividing device 3d according to the embodiment shown in FIG. 4A, and the flow dividing device 3d is a part of the cabinet 1 of the immersion cooling system 100c. Therefore, the flow dividing devices 3a, 3b, 3c may be plug-in flow dividing devices (referring to FIG. 1, FIG. 2, and FIG. 3), or a flow dividing device (referring to FIG. 4A, 4B) integrated with the cabinet 1 of the immersion cooling system, which depends on the need of a producer or a customer.

According to some embodiments, the flow dividing device is located on an outer side of the cabinet 1. In some embodiments, the inflow port 311 of the flow dividing device 3a is configured to air-tightly communicates with the guide outlet 42 of the flow guide assembly 4, the outflow port 312 of the flow dividing device 3a is configured to air-tightly communicates with the lower accommodating portion 12. In other words, the chamber C, the upper accommodating portion 11, and the lower accommodating portion 12 have the same pressure. In this way, the objective of effectively separating the cooling water L1 from the working fluid L2 can be achieved as well.

Figure 5:
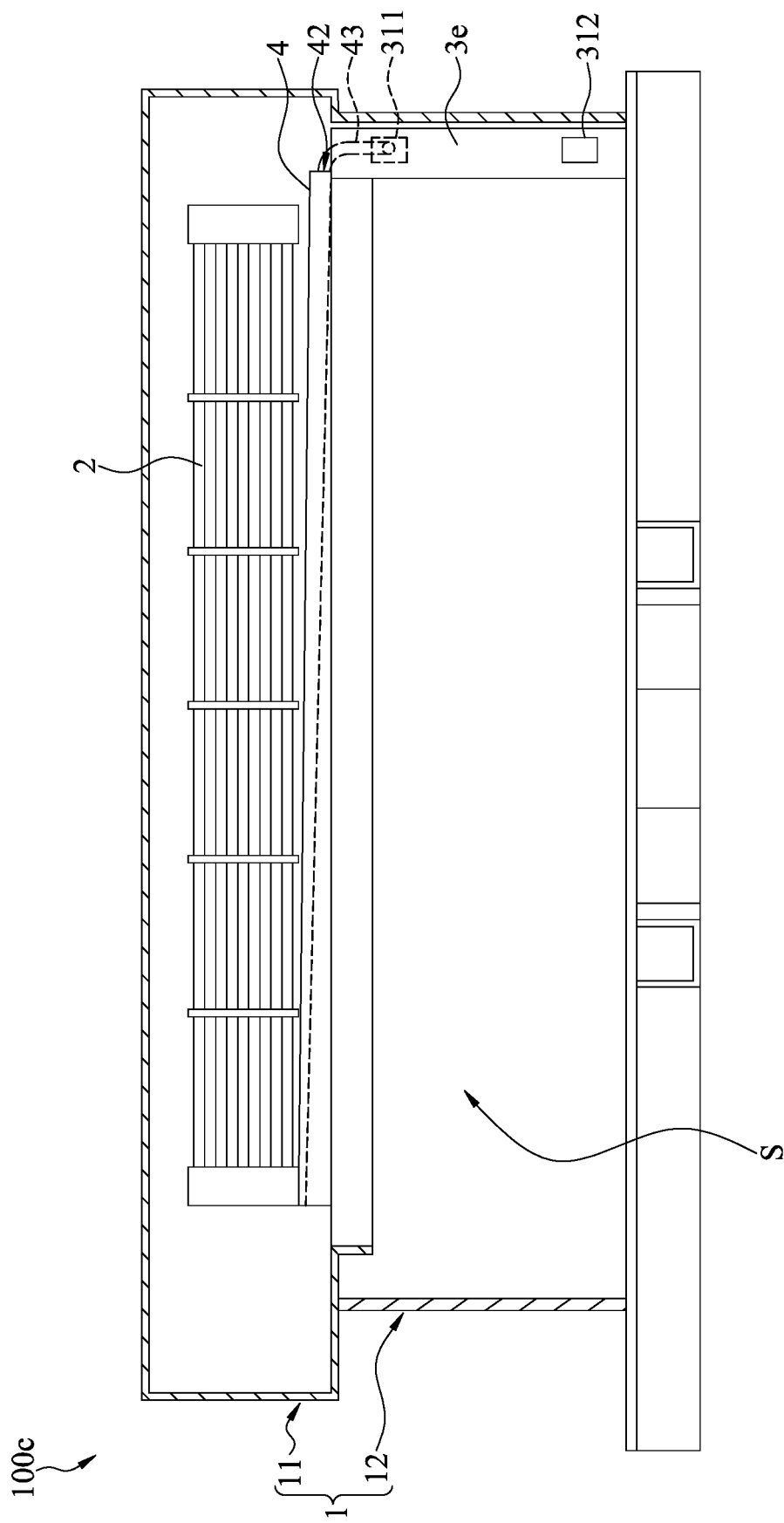
FIG. 5 illustrates a schematic diagram of the use of a flow guide module according to an embodiment.
Figure 6:
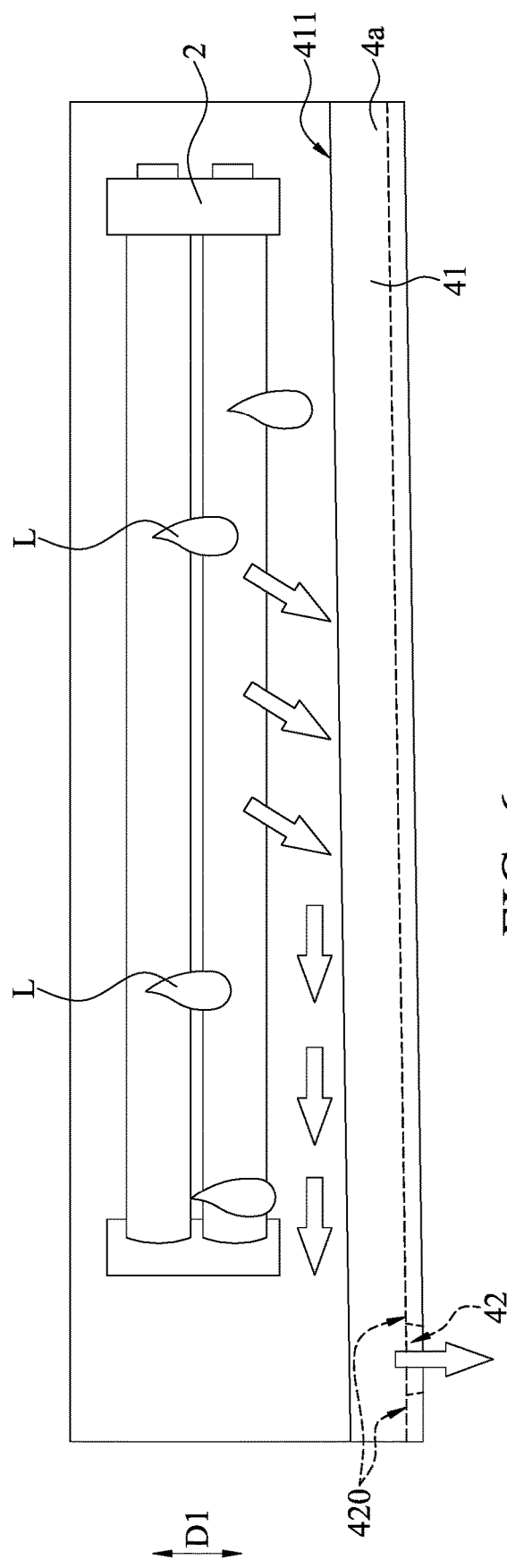
FIG. 6 illustrates a schematic structural diagram of a flow guide assembly according to an embodiment.

Referring to FIG. 5 and FIG. 6, FIG. 5 illustrates a schematic diagram of the use of a flow guide module according to an embodiment. FIG. 6 illustrates a schematic structural diagram of a flow guide assembly 4a according to an embodiment. In the immersion cooling system 100c, the lower accommodating portion 12 includes a predetermined space S, where the predetermined space S may accommodate at least the electronic device 90. Taking the embodiment in which the electronic device 90 is a server as an example, the width of the predetermined space S (a horizontal distance from the perspective of FIG. 5) may be 1 U, 2 U, 3 U, 4 U (details will be described later) etc. According to the embodiment shown in FIG. 5, the guide outlet 42 of the flow guide assembly 4 is in communication with a tube body 43, where the other end of the tube body 43 is in communication with the inflow port 311. The condensate fluid L is successfully guided to a flow dividing device 3e by using the tube body 43. According to the embodiment shown in FIG. 6, the receiving portion 41 of the flow guide assembly 4 includes a receiving surface 411, the guide outlet 42 is connected to the receiving surface 411, and a connection position 420 between the receiving surface 411 and the guide outlet 42 is lower than other positions of the receiving surface 411 in the perpendicular direction D1. The connection position 420 is a region of the receiving surface 411 surrounding the guide outlet 42. Therefore, the condensed condensate fluid L flows out of the guide outlet 42 due to a height difference after dropping on the receiving surface 411.

Figure 7:
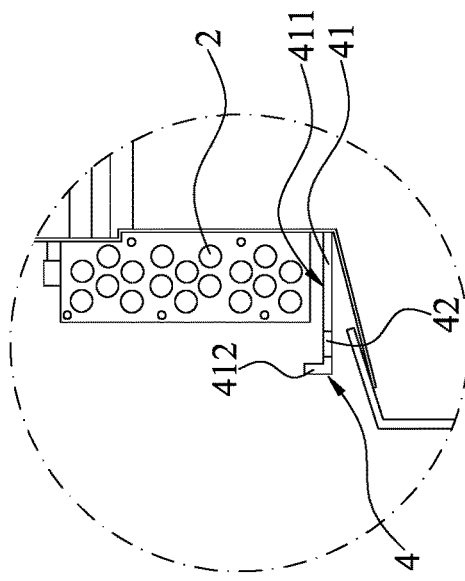
FIG. 7 illustrates a partial enlarged schematic diagram of reference numeral 7 in FIG. 2.

FIG. 7 illustrates a partial enlarged schematic diagram of reference numeral 7 in FIG. 2. According to this embodiment, the receiving portion 41 additionally includes a barrier strip 412, the barrier strip 412 is connected to the receiving surface 411 and protrudes (e.g., upwardly) from the receiving surface 411, and the barrier strip 412 is located on an outer side of the condensation module 2. The barrier strip 412 is configured to prevent the condensate fluid L from flowing out of the receiving surface 411 from the left side of FIG. 7, so that the condensate fluid L does not directly flow into the working fluid L2 of the lower accommodating portion 12.

Figure 8:
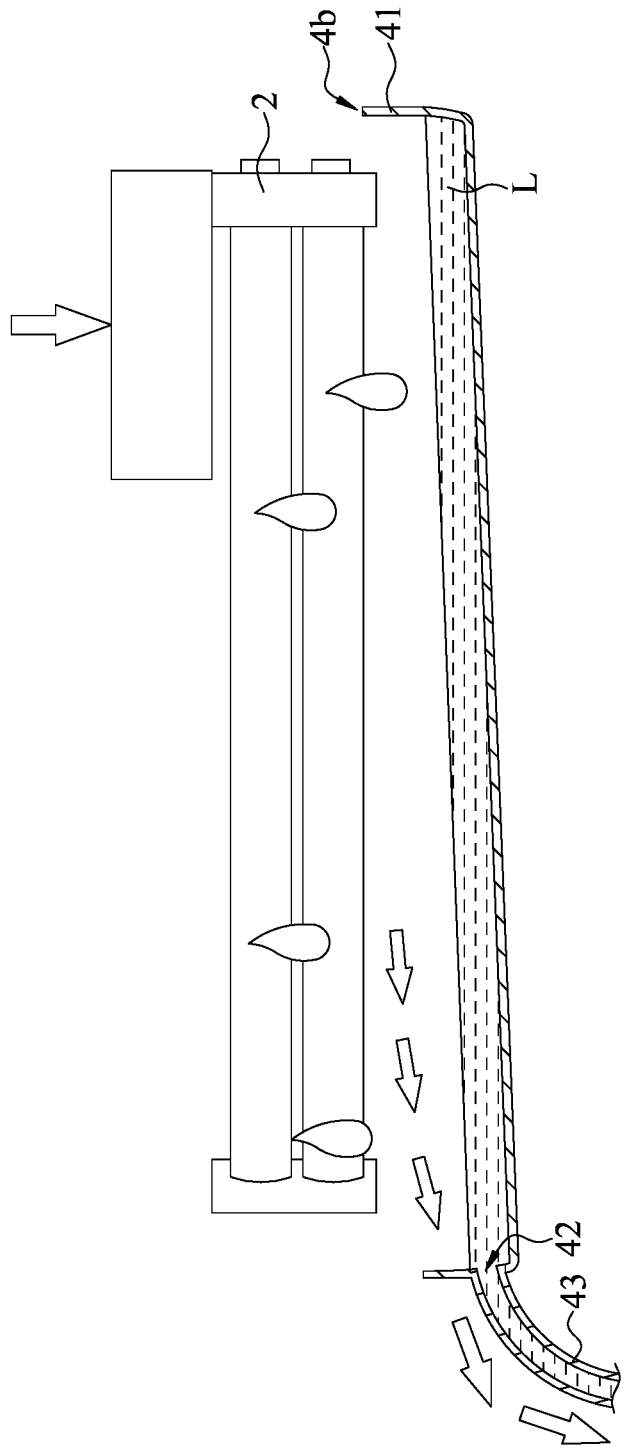
FIG. 8 illustrates a schematic structural diagram of a flow guide assembly according to an embodiment.

FIG. 8 illustrates a schematic structural diagram of a flow guide assembly 4b according to an embodiment. According to this embodiment, the receiving portion 41 is a generally U-shaped load plate and the guide outlet 42 is arranged on the load plate. The guide outlet 42 is in communication with the tube body 43, where the other end of the tube body 43 is in communication with the inflow port 311. The condensate fluid L is successfully guided to the flow dividing device by using the tube body 43.

Figure 9:
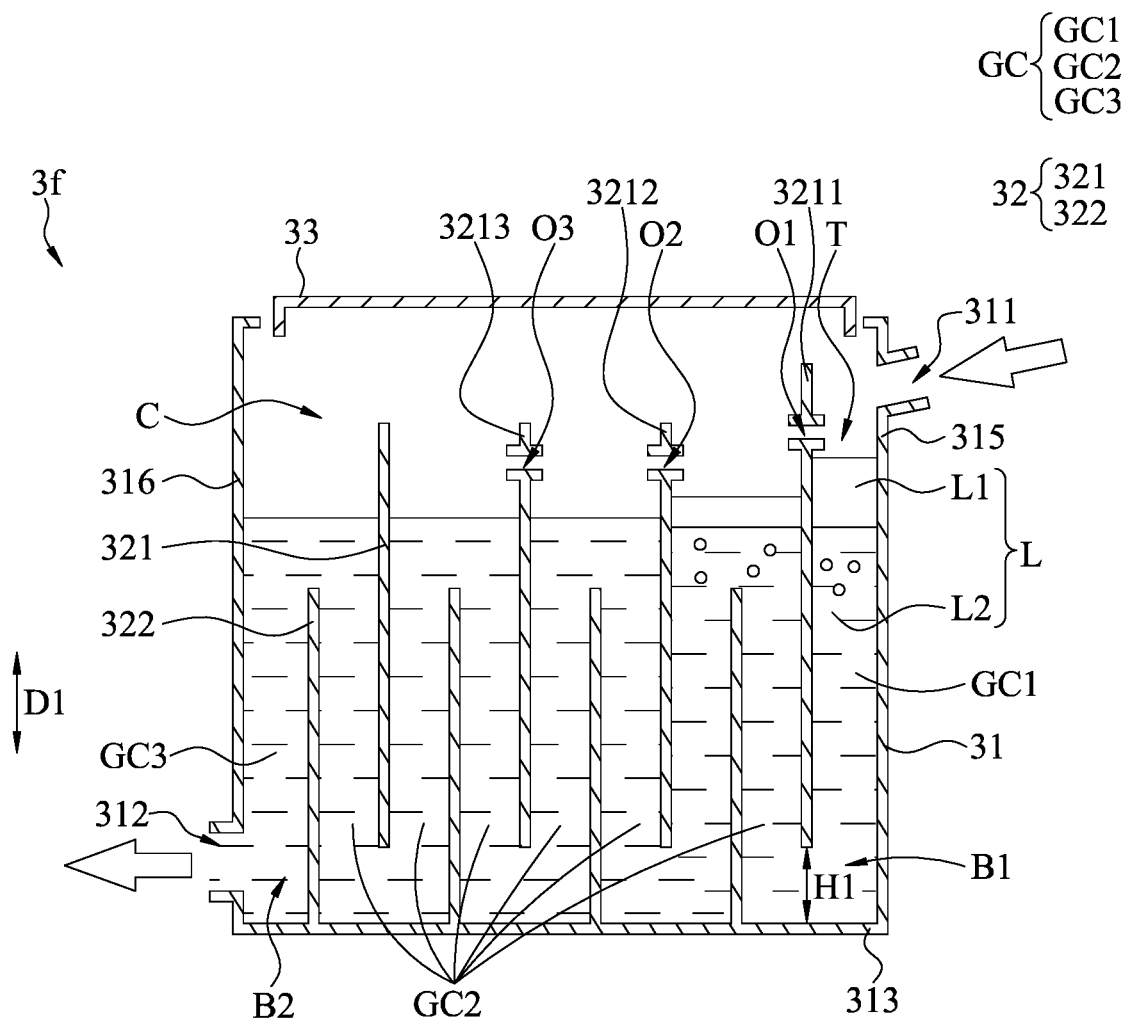
FIG. 9 illustrates a schematic diagram of a usage state of a flow dividing device according to an embodiment.
Figure 10:
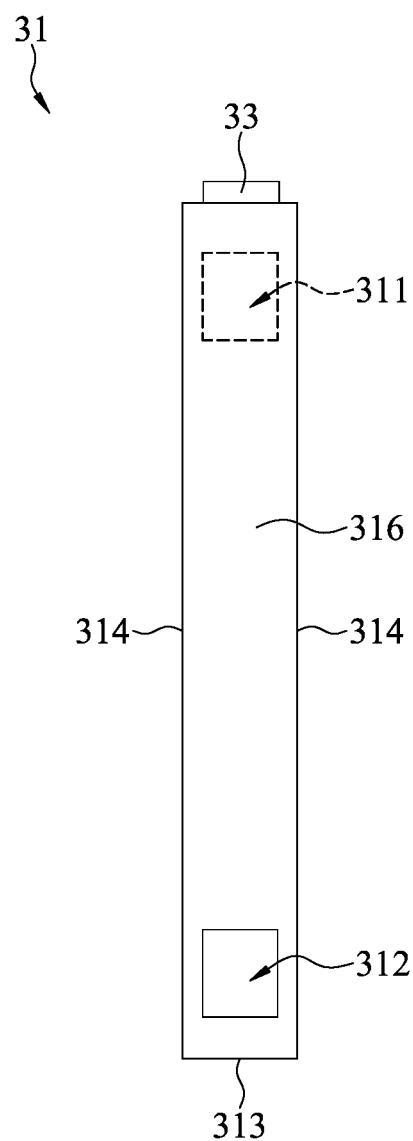
FIG. 10 illustrates a schematic diagram of an appearance of a box body according to an embodiment shown in FIG. 9.

Referring to FIG. 9 and FIG. 10, FIG. 9 illustrates a schematic diagram of a usage state of a flow dividing device 3f according to an embodiment. FIG. 10 illustrates a schematic diagram of an appearance of a box body 31 according to an embodiment shown in FIG. 9. The flow dividing device 3f in the embodiment may be a plug-in flow dividing device. The box body 31 includes a bottom wall 313, an inlet wall 315, an outlet wall 316, and two opposite side walls 314 (referring to FIG. 10). The chamber C is located between the two side walls 314. According to this embodiment, two opposite sides of the box body 31 are provided with the inflow port 311 and the outflow port 312 respectively. The inflow port 311 is located on the inlet wall 315 and the outflow port 312 is located on the outlet wall 316. In an embodiment, the inflow port 311 may be an entry arranged above the inlet channel GC1 (referring to FIG. 4B) in a perpendicular direction, and the outflow port 312 may be located on the side wall 314 on the left side from the perspective of FIG. 10.

The thickness of the box body 31 (that is, a horizontal width from the perspective of FIG. 10) may be related to the thickness of the electronic devices 90, 90', which means that the thickness of the box body 31 may be a multiple of 4.445 cm, such as 1 U, 2 U, 3 U or 4 U. In addition, the box body 31 may include a fixed structure conforming to a server rack. In this way, for the immersion cooling system conforming to the specification of a server cabinet, the plug-in flow dividing devices 3a, 3b, 3c, 3e may be combined with the server cabinet, the electronic devices 90, 90' can still be closely placed in the remaining space of the lower accommodating portion 12 of the cabinet 1, and the space in the lower accommodating portion 12 can be better utilized.

The baffle set 32 includes a plurality of upper baffles 321, the upper baffles 321 are located inside the chamber C, two sides of each upper baffle 321 are connected to the two side walls 314 respectively, and a flow distance H1 exists between the upper baffles 321 and the bottom wall 313 to divide the chamber C into the guide channels GC. The top T and the bottom B1 each refer to a space, and the top T is a space from above the inlet channel GC1 to the cover body 33. The bottom B1 is a space from below the inlet channel GC1 to the bottom wall 313. According to the embodiment shown in FIG. 9, the upper baffles 321 are arranged in parallel, the top of each guide channel GC is in a communication state, and the top of each upper baffle 321 is higher than the liquid level of the liquid in the chamber C. The flow dividing device 3f receives the condensate fluid L, and the condensate fluid L includes the working fluid L2 and the cooling water L1. The condensate fluid L enters the chamber C from the inflow port 311 and flows in the guide channel GC. When the condensate fluid L flows and passes through each channel GC1, GC2, and GC3, the cooling water with a lower specific weight floats on the liquid level of the working fluid L2 with a higher specific weight. In this way, the liquid flowing out of the outflow port 312 is merely the working fluid L2 located in the outlet channel GC3, so that the cooling water L1 is separated from the working fluid L2. The cooling water L1 may gather on the liquid level of the inlet channel GC1 and the liquid level of the middle channel GC2 which is closest to the inlet channel GC1, so as to be removed by the user.

According to the embodiment shown in FIG. 9, the baffle set 32 further includes a plurality of lower baffles 322, the lower baffles 322 are located inside the chamber C, two sides of each lower baffle 322 are connected to the two side walls 314 respectively, and a bottom of each lower baffle 322 is connected to the bottom wall 313. The lower baffles 322 and the upper baffles 321 are staggered to divide the chamber C into a plurality of guide channels GC, and the guide channels GC include an inlet channel GC1, a plurality of middle channels GC2, and an outlet channel GC3. The lower baffles 322 are lower than the upper baffles 321 in the perpendicular direction, that is, the top of each lower baffle 322 is lower than the top of each upper baffle 321. Compared with the flow dividing device with only the upper baffles (referring to the flow dividing device 3h shown in FIG. 12), the flow dividing device 3f provides a longer flowing path for the condensate fluid L, so that the cooling water L1 can be separated from the working fluid L2 in a sufficient time (that is, the cooling water L1 floats to the liquid level of the working fluid L2). In the embodiment shown in the drawings, the adjacent upper baffle 321 and lower baffle 322 are arranged in parallel. However, this is not limited in the disclosure. According to some embodiments, the upper baffles 321 and the lower baffles 322 are not arranged in parallel (referring to the following descriptions).

According to the embodiment shown in FIG. 9, the upper baffles 321 are called a first upper baffle 3211 and a second upper baffle 3212 starting from the inflow port 311, the first upper baffle 3211 includes a first flow dividing port O1, a position of the first flow dividing port O1 is lower than the position of the inflow port 311 in the perpendicular direction D1, and the first flow dividing port O1 is higher than the second upper baffle 3212. The first flow dividing port O1 has a function of dispersing the cooling water L1 located on the working fluid L2. In this embodiment, the second upper baffle 3212 includes a second flow dividing port O2, and a position of the second flow dividing port O2 in the perpendicular direction D1 is lower than the position of the first flow dividing port O1 and is higher than two adjacent lower baffles 322. In this way, the liquid level of the middle channel GC2 which is closest to the inlet channel GC1 may be maintained to be lower than the first flow dividing port O1, so that the liquid of the middle channel GC2 is prevented from flowing back to the inlet channel GC1 through the first flow dividing port O1. In addition, water can be dispersed more efficiently by the first flow dividing port O1 cooperating with the second flow dividing port O1. The quantity of flow dividing ports is not limited in the disclosure. According to the embodiment shown in FIG. 9, a third flow dividing port O3 is provided on a third upper baffle 3213 which is adjacent to the second upper baffle 3212. According to other embodiments, one flow dividing port O is provided (referring to the embodiment shown in FIG. 16). In other words, the quantity of flow dividing ports O is configured according to the need of a user or a producer.

Figure 11:
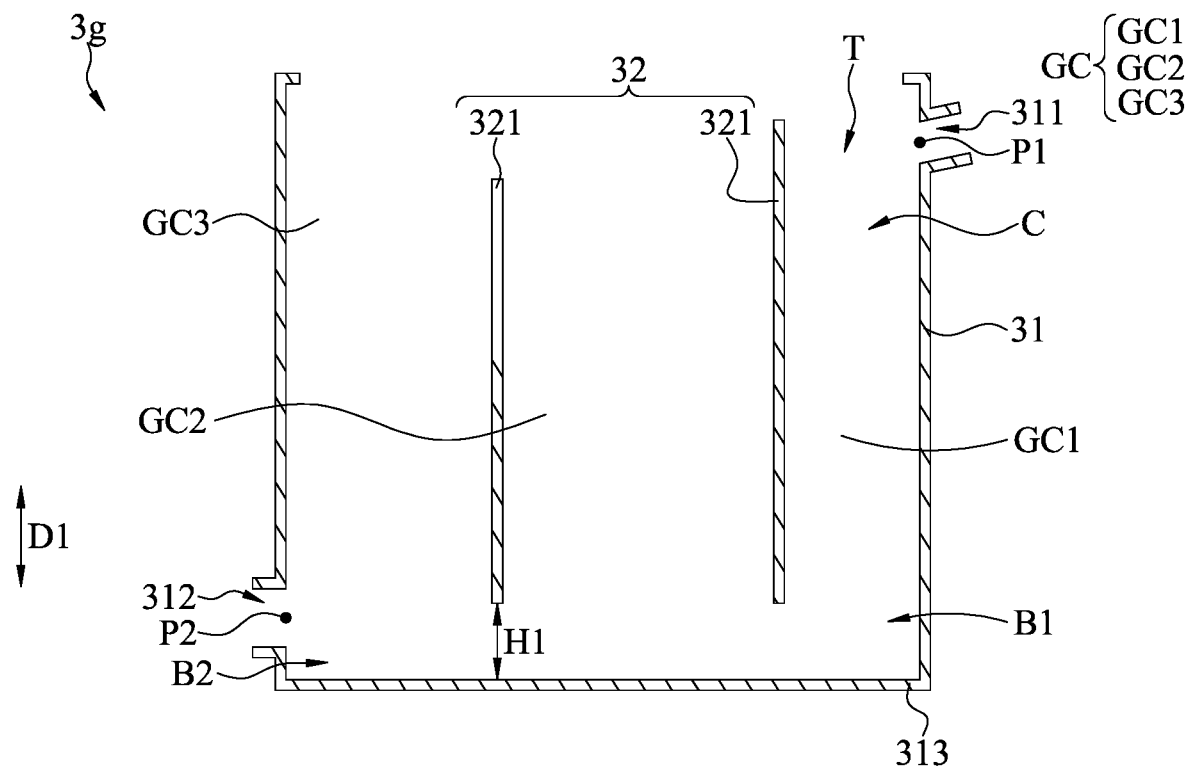
FIG. 11 illustrates a schematic structural diagram of a flow dividing device according to an embodiment.

FIG. 11 illustrates a schematic structural diagram of a flow dividing device 3g according to an embodiment. According to the embodiment shown in FIG. 11, the baffle set 32 includes two upper baffles 321, where a top of the upper baffle 321 which is adjacent to the inflow port 311 is higher than the adjacent upper baffle 321, to prevent the cooling water L1 separated in the inlet channel GC1 from flowing to the middle channel GC2 or the outlet channel GC3. In an embodiment, the baffle set 32 includes an upper baffle 321 and a lower baffle 322, the upper baffle 321 is adjacent to the inflow port 311, and the lower baffle 322 is adjacent to the outflow port 312. This embodiment may have a longer flowing channel path than the embodiment shown in FIG. 11.

Figure 12:
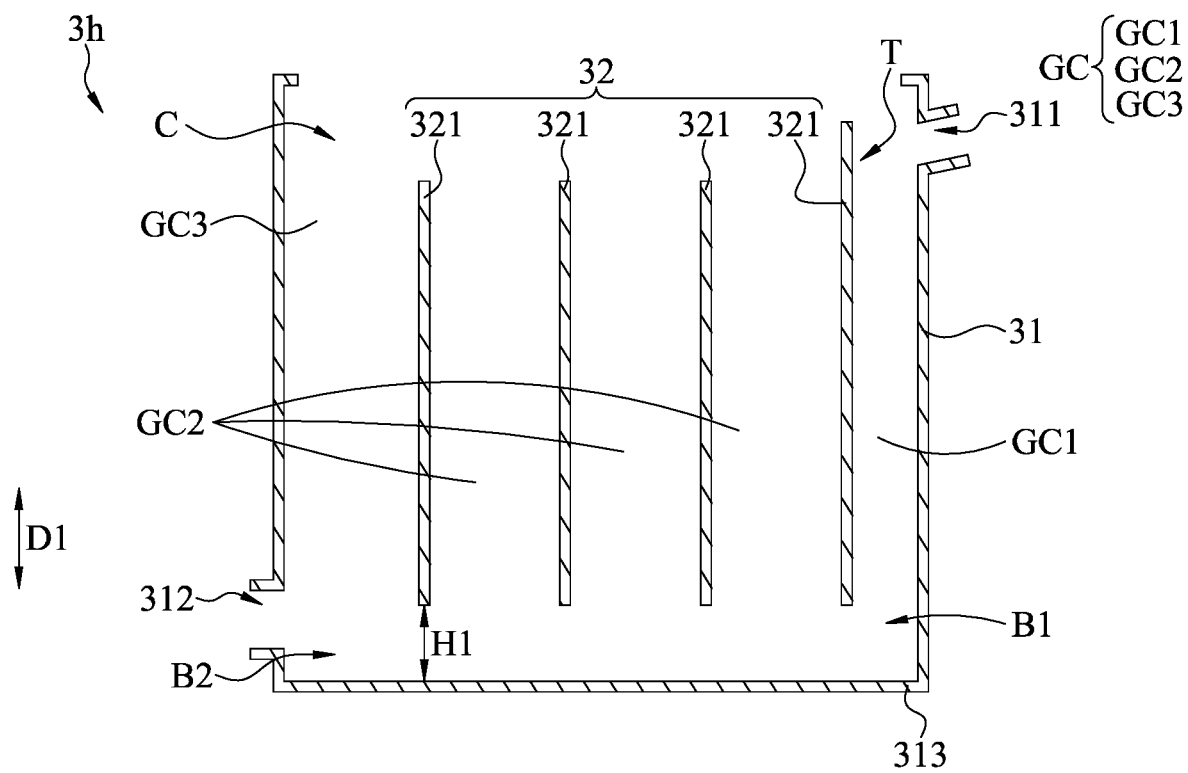
FIG. 12 illustrates a schematic structural diagram of a flow dividing device according to an embodiment.

FIG. 12 illustrates a schematic structural diagram of a flow dividing device 3h according to an embodiment. According to the embodiment shown in FIG. 12, the baffle set 32 includes a plurality of upper baffles 321. The upper baffles 321 are arranged in parallel, and divide the chamber C into a plurality of guide channels GC. As the condensate fluid L passes through more guide channels GC, the cooling water L1 has a longer time to be separated from the working fluid L2, achieving a better separation effect.

According to the embodiments shown in FIG. 11 and FIG. 12, the flow dividing devices 3g, 3h do not have the cover body 33 (referring to FIG. 13), and an upper part of the inlet channel GC1 may also be used as the inflow port 311.

Figure 13:
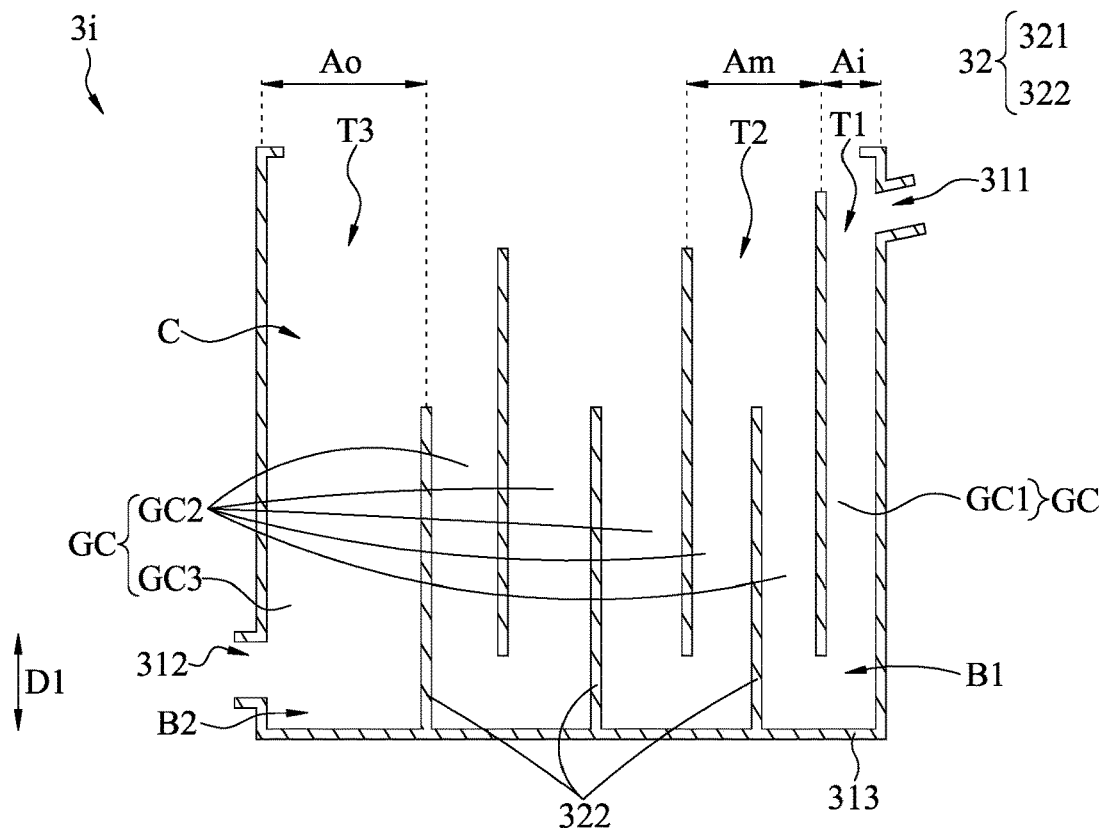
FIG. 13 illustrates a schematic structural diagram of a flow dividing device according to an embodiment.

FIG. 13 illustrates a schematic structural diagram of a flow dividing device 3i according to an embodiment. According to this embodiment, the cross-sectional area of the top T1 of the inlet channel GC1 defines a cross-sectional area Ai, the cross-sectional area of the top T2 of the middle channels GC2 adjacent to the inflow port 311 defines a cross-sectional area Am, and the cross-sectional area of the top T3 of the outlet channel GC3 defines a cross-sectional area Ao. The sizes and relative relationship of the cross-sectional areas are not limited in the disclosure, and different designs are used depending on the needs of users. According to the embodiment shown in FIG. 13, the cross-sectional area Ao is greater than the cross-sectional area Am that is greater than the cross-sectional area Ai. The heights and relative position of the upper baffle 321 and the lower baffle 322 are not limited by the drawings and can be adjusted according to the needs of users.

Figure 14:
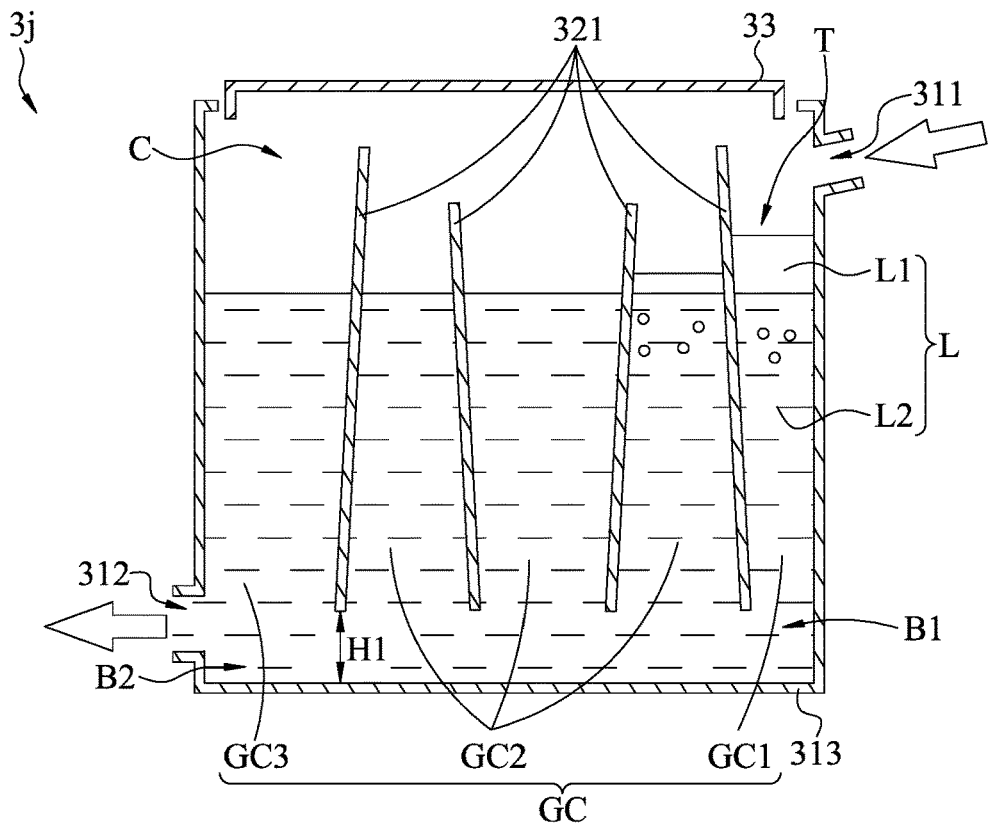
FIG. 14 illustrates a schematic structural diagram of a flow dividing device according to an embodiment.

FIG. 14 illustrates a schematic structural diagram of a flow dividing device 3j according to an embodiment. According to this embodiment, the baffle set 32 includes a plurality of upper baffles 321. Adjacent upper baffles 321 are not arranged parallel to each other, while there is still an interval between the adjacent upper baffles 321, so that the retention time of the condensate fluid L in the inlet channel GC1 is long enough to separate the cooling water L1 from the working fluid L2 to some extent.

Figure 15:
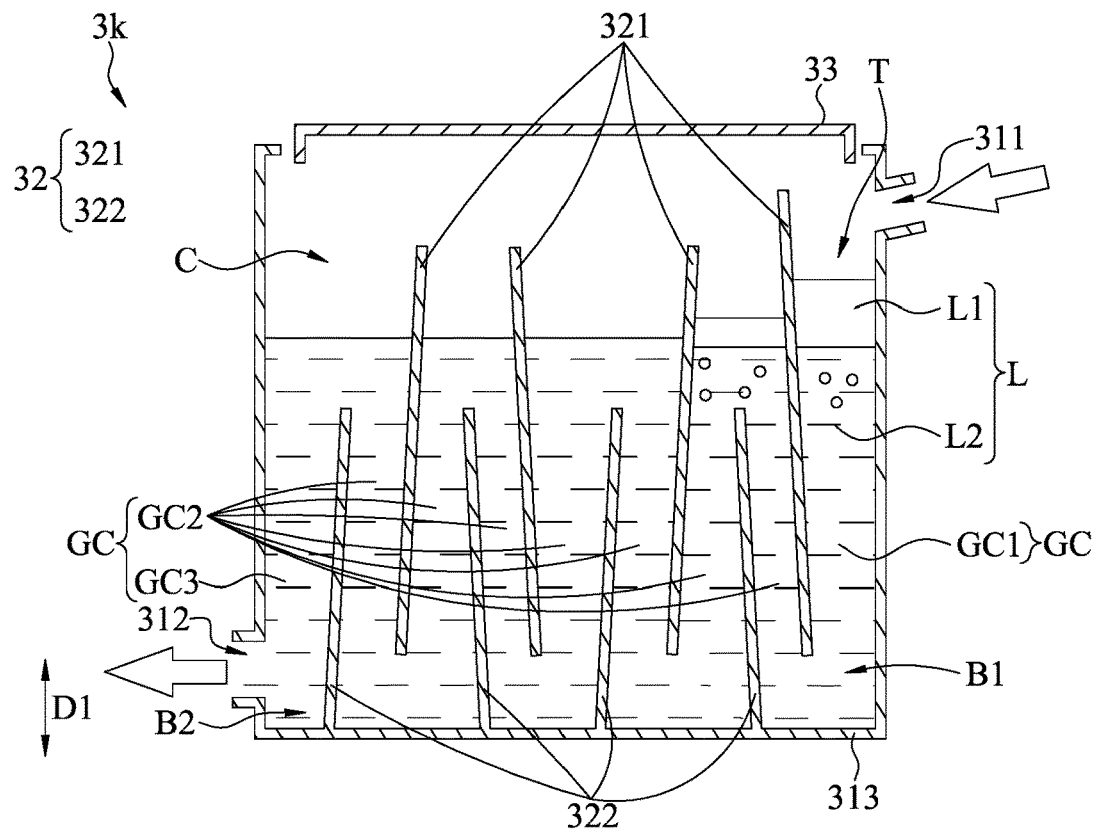
FIG. 15 illustrates a schematic structural diagram of a flow dividing device according to an embodiment.

FIG. 15 illustrates a schematic structural diagram of a flow dividing device 3k according to an embodiment. According to this embodiment, the baffle set 32 includes a plurality of upper baffles 321 and a plurality of lower baffles 322. The upper baffles 321 and the lower baffles 322 are staggered and are not arranged in parallel, so as to divide the chamber C into a plurality of guide channels GC, including an inlet channel GC1, a plurality of middle channel GC2, and an outlet channel GC3. Therefore, during flowing of the condensate fluid L, the retention time of the condensate fluid L in the inlet channel GC1 is long enough to separate the cooling water L1 from the working fluid L2 to some extent.

Figure 16:
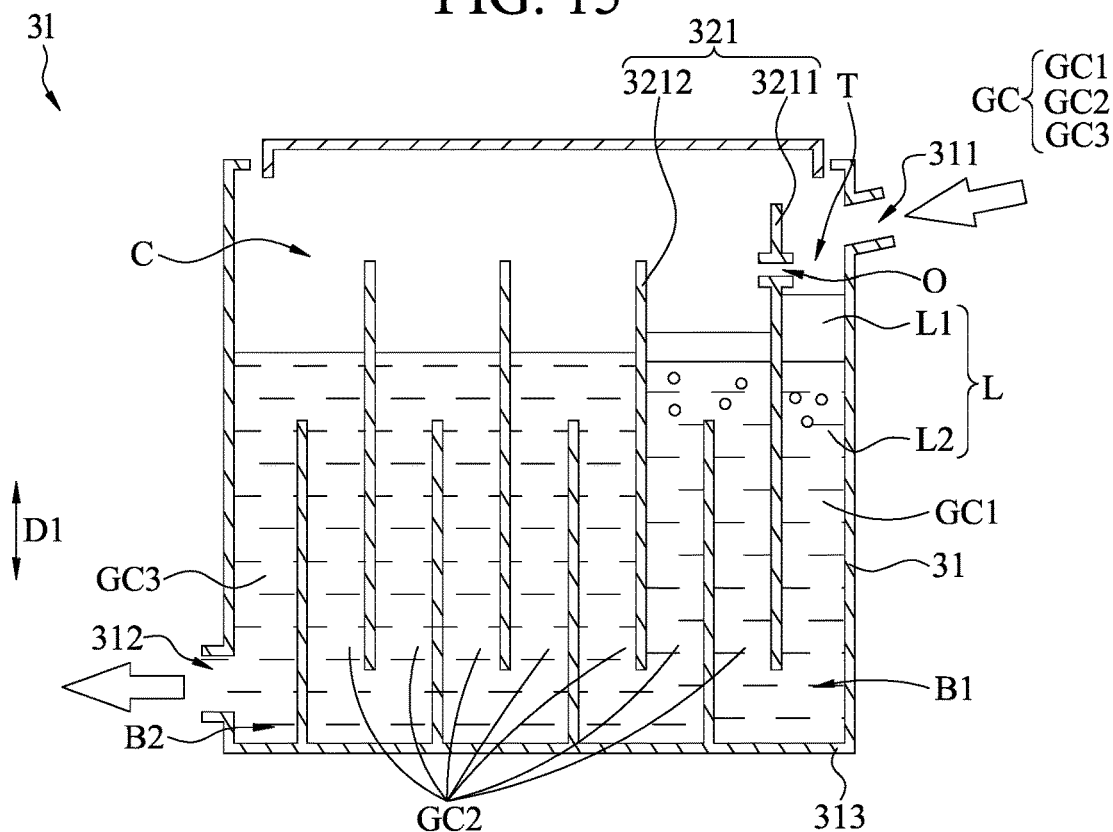
FIG. 16 illustrates a schematic structural diagram of a flow dividing device according to an embodiment.

FIG. 16 illustrates a schematic structural diagram of a flow dividing device 3l according to an embodiment. According to the embodiment shown in FIG. 16, two upper baffles 321 adjacent to the inflow port 311 are called a first upper baffle 3211 and a second upper baffle 3212 respectively. One flow dividing port O is provided on the upper part of the first upper baffle 3211. The position height of the flow dividing port O is equivalent to the top of the second upper baffle 3212, or higher than the top of the second upper baffle 3212. The flow dividing port O has a function of dispersing the separated cooling water L1, so as to avoid the accumulation of water above the inlet channel GC1.

Figure 17:
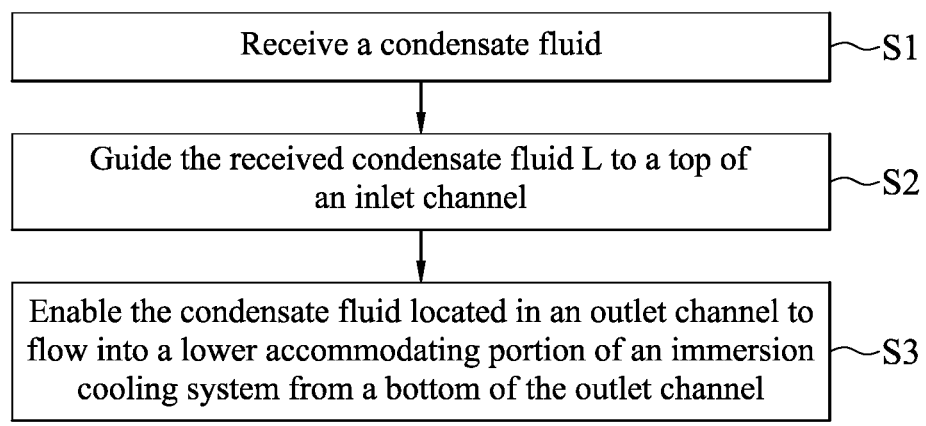
FIG. 17 illustrates a flowchart of steps of a fluid separation method of an immersion cooling system according to an embodiment.

Referring to FIG. 17 and FIG. 2, FIG. 17 illustrates a flowchart of steps of a fluid separation method of an immersion cooling system according to an embodiment. The fluid separation method is applicable to separating a condensate fluid L. The method includes the following steps: Step 1: Receive the condensate fluid L, where the condensate fluid L is a condensate fluid received by a flow guide assembly 4. Step 2: Guide the received condensate fluid L to a top T of an inlet channel GC1. The top T of the inlet channel GC1 is higher than a bottom B1 of the inlet channel GC1, and the bottom B1 of the inlet channel GC1 communicates with an outlet channel GC3. As shown in FIG. 2, the top T and the bottom B1 are spatial meanings, and the top T is a space from above the inlet channel GC1 to the cover body 33. The bottom B1 is a space from below the inlet channel GC1 to the bottom wall 313. Step 3: Enable the condensate fluid L located in an outlet channel GC3 to flow into a lower accommodating portion 12 of an immersion cooling system 100a from a bottom B2 of the outlet channel GC3, as shown in FIG. 2.

According to some embodiments, the bottom B1 of the inlet channel GC1 communicates with the outlet channel GC3 through a middle channel GC2, as shown in FIG. 2. According to some embodiments, the top T corresponding to the inlet channel GC1 includes a flow dividing port O, and the position of the flow dividing port O is higher than the middle channel GC2 in the perpendicular direction D1, as shown in FIG. 2. The flow dividing port O can disperse a cooling water L1 located above a working fluid L2, to avoid the accumulation of the water on the top T of the inlet channel GC1.

According to some embodiments, the flow dividing device includes a box body and a baffle set. Therefore, after the condensate fluid condenses through the condensation module, the condensate fluid mixed with cooling water first enters the flow dividing device, and passes through a plurality of guide channels formed by the baffle set in the chamber. During the flowing process of the condensate fluid, due to different properties of the cooling water and the working fluid, the cooling water is separated from the working fluid. The separation is, for example, stratification. According to an embodiment, the separation is implemented by a difference between specific weights. Since the specific weight of the cooling water is less than the specific weight of the condensate fluid, when the condensate fluid mixed with the cooling water flows in the flow dividing device, the cooling water will float to the liquid level of the working fluid, and stratification of the cooling water and the working fluid occurs. The working fluid in a lower layer will flow out of the outlet channel through the outflow port to cool an electronic device immersed in the lower accommodating portion. In this way, the problem of condensate fluid contamination can be alleviated.

According to some embodiments, in the flow dividing device, the cooling water layer in the working fluid may be taken out in a manner of manual extraction. According to some embodiments, the amount of water is detected automatically, and the cooling water is extracted by using a motor. According to some embodiments, a drain line is arranged to guide the cooling water to flow out. According to some embodiments, the cooling water is absorbed through a filterable hygroscopic material. The method for extracting the cooling contaminated water is not limited in the disclosure.

The disclosure further provides a fluid separation method of an immersion cooling system. According to some embodiments, the cooling water is separated from other contaminates in the condensate fluid during the flowing of the condensate fluid. In this way, the condensate fluid is divided into the cooling water and the working fluid after separation, and the condensate fluid flows in the lower accommodating portion of the immersion cooling system through the outlet channel, to cool the electronic device located in the lower accommodating portion.

What is claimed is:

1. An immersion cooling system, comprising:
a cabinet comprising an upper accommodating portion and a lower accommodating portion;
a condensation module, located inside the upper accommodating portion;
a flow guide assembly, comprising a receiving portion and a guide outlet, wherein the receiving portion is located below the condensation module; and
a flow dividing device, comprising:
a box body, comprising a chamber, wherein the box comprises an inflow port and an outflow port; and in a perpendicular direction, a position of the inflow port is higher than a position of the outflow port and the outflow port communicates with the lower accommodating portion; and
a baffle set, located in the chamber and dividing the chamber into a plurality of guide channels, wherein the guide channels comprise an inlet channel, a middle channel, and an outlet channel, a top of the inlet channel communicates with the inflow port, a bottom of the inlet channel communicates with the middle channel, the middle channel communicates with the outlet channel, and the outlet channel communicates with the outflow port;
wherein the box body comprises a bottom wall and two opposite side walls, and the chamber is located between the two side walls; the baffle set comprises a plurality of upper baffles, the upper baffles are located inside the chamber, two sides of each upper baffle are connected to the two side walls respectively, and a flow distance exists between the upper baffles and the bottom wall to divide the chamber into the guide channels;
wherein the upper baffles are called a first upper baffle and a second upper baffle starting from the inflow port, the first upper baffle comprises a first flow dividing port, a position of the first flow dividing port is lower than the position of the inflow port in the perpendicular direction, and the first flow dividing port is higher than the second upper baffle;
wherein the second upper baffle comprises a second flow dividing port, and a position of the second flow dividing port in the perpendicular direction is lower than the position of the first flow dividing port and is higher than two adjacent lower baffles.

2. The immersion cooling system according to claim 1, wherein the baffle set further comprises a plurality of lower baffles, the lower baffles are located inside the chamber, two sides of each lower baffle are connected to the two side walls respectively, a bottom of each lower baffle is connected to the bottom wall, the lower baffles and the upper baffles are staggered to divide the chamber into the guide channels, and the lower baffles are lower than the upper baffles in the perpendicular direction.

3. The immersion cooling system according to claim 1, wherein the receiving portion comprises a receiving surface, the guide outlet is connected to the receiving surface, and a connection position between the receiving surface and the guide outlet is lower than other positions of the receiving surface in the perpendicular direction.

4. The immersion cooling system according to claim 3, wherein the receiving surface further comprises a barrier strip, the barrier strip is connected to the receiving surface and protrudes from the receiving surface, and the barrier strip is located on an outer side of the condensation module.

5. The immersion cooling system according to claim 1, wherein the flow guide assembly further comprises a tube body, and the tube body is in communication with both the guide outlet and the inflow port.

6. The immersion cooling system according to claim 1,
the baffle set further comprises a plurality of lower baffles, the lower baffles are located inside the chamber, two sides of each lower baffle are connected to the two side walls respectively, a bottom of each lower baffle is connected to the bottom wall, the lower baffles and the upper baffles are staggered to divide the chamber into the guide channels, and the lower baffles are lower than the upper baffles in the perpendicular direction;
the receiving portion comprises a receiving surface, the guide outlet is connected to the receiving surface, and a connection position between the receiving surface and the guide outlet is lower than other positions of the receiving surface in the perpendicular direction;
the receiving surface further comprises a barrier strip, the barrier strip is connected to the receiving surface and protrudes from the receiving surface, and the barrier strip is located on an outer side of the condensation module; and
the flow guide assembly further comprises a tube body, and the tube body is in communication with both the guide outlet and the inflow port.

7. A flow dividing device, comprising:
a box body, comprising a chamber, wherein the box comprises an inflow port and an outflow port; and in a perpendicular direction, a position of the inflow port is higher than a position of the outflow port; and
a baffle set, located in the chamber and dividing the chamber into a plurality of guide channels, wherein the guide channels comprise an inlet channel, a middle channel and an outlet channel, a top of the inlet channel communicates with the inflow port, a bottom of the inlet channel communicates with the middle channel, the middle channel communicates with the outlet channel, and the outlet channel communicates with the outflow port;
wherein the box body comprises a bottom wall and two opposite side walls, and the chamber is located between the two side walls; the baffle set comprises a plurality of upper baffles, the upper baffles are located inside the chamber, two sides of each upper baffle are connected to the two side walls respectively, and a flow distance exists between the upper baffles and the bottom wall to divide the chamber into the guide channels;
wherein the baffle set further comprises a plurality of lower baffles, the lower baffles are located inside the chamber, two sides of each lower baffle are connected to the two side walls respectively, a bottom of each lower baffle is connected to the bottom wall, the lower baffles and the upper baffles are staggered to divide the chamber into the guide channels, and the lower baffles are lower than the upper baffles in the perpendicular direction;
wherein the upper baffles are called a first upper baffle and a second upper baffle starting from the inflow port, the first upper baffle comprises a first flow dividing port, a position of the first flow dividing port is lower than the position of the inflow port in the perpendicular direction, and the first flow dividing port is higher than the second upper baffle;
wherein the second upper baffle comprises a second flow dividing port, a position of the second flow dividing port in the perpendicular direction is lower than the position of the first flow dividing port and is higher than two adjacent lower baffles.

* * * * *